(12) United States Patent
Xiao et al.

(10) Patent No.: US 6,229,337 B1
(45) Date of Patent: May 8, 2001

(54) HIGH-DENSITY PROGRAMMABLE LOGIC DEVICE WITH FLEXIBLE LOCAL CONNECTIONS AND MULTIPLEXER BASED GLOBAL INTERCONNECTIONS

(75) Inventors: Ping Xiao, Union City; Yiyian P. Yin, Campbell, both of CA (US)

(73) Assignee: ICT Acquisition, Inc., San Jose, CA (US)

( * ) Notice: Subject to any disclaimer, the term of this patent is extended or adjusted under 35 U.S.C. 154(b) by 0 days.

(21) Appl. No.: 09/334,143

(22) Filed: Jun. 15, 1999

(51) Int. Cl.[7] ................................................. H01L 25/00

(52) U.S. Cl. ................................. 326/41; 326/39; 326/38

(58) Field of Search ................................ 326/41, 37, 38, 326/39

(56) References Cited

U.S. PATENT DOCUMENTS

| | | | |
|---|---|---|---|
| 4,124,899 | 11/1978 | Birkner et al. | 364/716 |
| 4,918,641 | 4/1990 | Jigour et al. | 364/716 |
| 5,046,035 | 9/1991 | Jigour et al. | 364/716 |
| 5,371,422 | 12/1994 | Patel et al. | 326/41 |
| 5,473,266 | 12/1995 | Ahanin et al. | 326/41 |
| 5,483,178 | 1/1996 | Costello et al. | 326/41 |
| 5,631,576 | 5/1997 | Lee et al. | 326/39 |
| 6,057,704 | * 5/2000 | New et al. | 326/41 X |
| 6,150,841 | * 11/2000 | Agrawal et al. | 326/41 |

\* cited by examiner

*Primary Examiner*—Huang Hoang
(74) *Attorney, Agent, or Firm*—Townsend and Townsend and Crew LLP; Henry K. Woodward

(57) ABSTRACT

A high-density programmable logic device is presented, comprising two or more logic built-in blocks interconnected by a programmable global interconnect multiplex matrix. Each logic built-in block contains four groups of four macrocells and four I/O cells, two sub AND arrays and four sub OR arrays. Each sub OR array couples a group of macrocells, and each sub AND array drives two sub OR arrays. The sub AND and OR arrays can either function independently or be connected together by AND array or OR array connection facilities, to extend the logic capability. Every macrocell can be flexibly controlled by three levels of control signal: global, logic built-in block wide or separate. The outputs from the macrocells and the inputs from I/O cells can be fed locally back through the local feedback path, and also fed globally to other logic built-in blocks, through the global interconnect multiplex matrix. The interconnections in the global interconnect multiplex matrix are in an exclusive mode, such that only the feedbacks from other logic built-in blocks can be routed into a certain logic built-in block. All the global feedbacks are fed to the multiplexers in a specific pattern that maximizes the routeability of a selected global feedback to a selected logic built-in block input, while maintaining high speed and using less chip array.

27 Claims, 14 Drawing Sheets

I1 and I2 have same output pattern.
So, if I1--> O1, I2-->O2, I1 and I2 are unchangeable
Routeability becomes lower.

The output patterns of I1, I2, I3, and I4 form a cyclic chain.
So, if I1-->O1, I2-->O2, I3-->O3 and I4-->O4,
I1, I2, I3, and I4 are unchangeable, and I5 will never have
the chance to be routed to output.

HIGH-DENSITY PROGRAMMABLE LOGIC DEVICE WITH FLEXIBLE LOCAL CONNECTIONS AND MULTIPLEXER BASED GLOBAL INTERCONNECTIONS

BACKGROUND OF THE INVENTION

This invention relates to programmable logic devices, and more particularly it relates to architecture for a high-density programmable logic device, with flexible local connections and local controls, as well as fast multiplexer based global interconnections.

Most medium and high-density complex programmable logic devices have evolved from simple programmable logic devices (SPLD). They feature a structure of logic blocks connected by a programmable global interconnection facility that allows information to be exchanged between the logic blocks. The logic block, which is functionally like a simple programmable logic device, normally comprise a PLA (usually an AND array drives an OR array) and a number of macrocells. The introduction of the global interconnection allows the implementation of logic more complex than that which can be fitted in an SPLD. This is achieved by mapping complex logic into different logic blocks, and connecting the blocks, through the programmable global interconnection, according to the application logic function. The main features of these devices, such as speed performance, density, logic flexibility, effective utilization of resources, and software complexity required for mapping an application design, rely heavily on logic block structure, global interconnection structure, and how they are scheduled and connected to balance the conflicting factors.

Some programmable logic devices, especially medium density complex programmable logic devices, and high-density programmable logic devices with low performance, utilize a full-cross point global programmable interconnect array (PIA) to interconnect the logic blocks. All global signals are typically brought in to the programmable interconnect array and the input signals from each logic block are generated in the programmable interconnect array. Each input signal for the logic block is essentially a function of all global signal sources. This global connectivity approach provides 100% connectivity for all global signals, and greatly alleviates software complexity and facilitates signal routeability.

However, to meet ever increasing technological demands, programmable logic devices have been constantly increasing in both size and complexity. In particular, to achieve higher logic density, more logic blocks, and thus more global signals, have been incorporated into programmable logic devices. This results in an almost exponential increase in the size of the programmable interconnect array. On the other hand, a major speed limitation of the programmable logic device is capacitive loading in the elements of the programmable interconnect array. Increasing the size of the programmable interconnect array leads to an undesirable reduction in speed. Furthermore, since the programmable interconnect array is monolithic, the number of input signals needed is usually significantly smaller than the full capability of the device. As a result, most of the signal paths remain unutilized. This represents a significant wastage of resources. As the disadvantages of silicon die size increase, speed degradation, and wasted resources make the programmable interconnect array approach no longer suitable for programmable logic devices with ever increasing density and complexity.

An alternative to the programmable interconnect array in high-density complex programmable logic devices is the multiplexer based, sparse global interconnect matrix structure. This approach focuses on optimized routeability, speed, and die size in a more intelligent manner. In this structure, the programmable elements in the programmable interconnect array are replaced by a group of multiplexers in a new programmable global interconnect multiplex matrix. Only selected global signals are connected to the inputs of the multiplexers, in a predetermined optimized pattern, and the outputs of the multiplexers are connected to the inputs of logic blocks. This structure has four important parameters: routeability (chances for every global signal to be routed to the inputs of a logic block), number of global signals, number of logic block inputs, and multiplexer size. These parameters have a relationship described by the following equation: Routeability=(multiplexer size×number of logic block inputs)/number of global signals. With the increase in density of the device, the number of global signals is consequently increased, while keeping the number of logic block inputs unchanged, the multiplexer size is necessarily increased to maintain the routeability. Unfortunately, a larger multiplexer structure results in slower performance and bigger die sizes.

Another problem with some higher-density programmable logic devices using the programmable global interconnect multiplex matrix is that, in order to have a simplified timing model and timing characteristics, all the feedbacks from a logic block are fed to the global interconnect multiplex matrix as global signals, though some of them are merely fed back to the local logic block. The purpose of the global interconnect multiplex matrix is to intelligently offer interconnects, between logic blocks from a group of limited resources. If the local signals are fed back to local logic blocks through some of these global resources, more outputs from the global interconnect multiplex matrix are needed. This will also result in a greater number of muliplexers and bigger die sizes.

In view of the foregoing, it would be desirable to be able to provide a high-density programmable logic device architecture that utilizes the multiplexer based global interconnections instead of the programmable interconnect array.

It would further be desirable to be able to provide a high density programmable logic device architecture, in which the structure of the logic block is flexible enough to handle all the local signals, and in which only global signals to other logic blocks utilize multiplexer based global interconnection resources.

It would also be desirable to be able to provide a high-density programmable logic device architecture with balanced routeability and speed.

SUMMARY OF THE INVENTION

It is an object of this invention to provide a high-density programmable logic device architecture that uses a multiplexer based global interconnections to achieve higher speed and smaller die size.

It is a further object of this invention to provide a high-density programmable logic device architecture, in which only global signals to other logic blocks consume global interconnection resources.

It is yet a further object of this invention to provide a high-density programmable logic device architecture with balanced routeability and speed.

These and other objects are accomplished in accordance with the principles of the present invention, by providing a high-density complex programmable logic device architecture, in which a multiplexer based interconnections, referred to as the global interconnect multiplex matrix, is employed to interconnect two or more logic built-in blocks.

In the present invention, the global input signals to the global interconnect multiplex matrix comprise both the feedback signals from the output of macrocells and the input feedback signals from I/O cells. Through the global interconnect multiplex matrix, every global input signal (macrocell output or external input) from one of the logic built-in blocks can be configured to reach any other logic built-in block. Each input signal has an average of three possible paths to be connected to a logic built-in block. The connections are arranged in an optimized pattern to maximize routeability. Besides going to the global interconnect multiplex matrix, the global input signals are also fed to local logic built-in blocks directly. The global interconnections are in an exclusive mode, such that only signals from other logic built-in blocks use the global interconnect multiplex matrix. The local feedbacks are fed to local logic built-in blocks, through local feedback paths, without taking limited global routing resources.

Compared with the architectures of the prior art programmable logic devices, the exclusive global interconnect multiplex matrix structure of this invention minimizes the size of the global interconnects, thus the die size of the device, while providing the advantages of high speed and low power consumption.

The structure of the exclusive global interconnect multiplex matrix requires that the logic built-in block be more flexible, to maximize the local logic capability within a logic built-in block, and minimize global loading. In the logic built-in blocks of the present invention, the direct local feedback path makes it possible to implement some logic within a built-in block, without involving the global interconnects. The AND array is divided into two sub arrays, connected by a connection configuration bit line. This structure can provide extra logic product terms when disconnected, or extra logic capacity, when connected according to the application logic. The OR array is utilized in the logic built-in block, instead of a fixed OR gate, to gain logic allocation flexibility and logic input and output exchangeability, which can eliminate complex logic allocation logic and output switching logic.

A feature of the invention is a high-density programmable logic device architecture utilizing the multiplexer based global interconnections to achieve higher speed, while maintaining smaller die size.

Another feature of the invention is that the multiplexer based global interconnections is in an exclusive mode, in which only the global signals from one logic built-in block to another consume the global interconnection resources.

Still another feature of the invention is a high-density programmable logic device architecture, with balanced routeability and speed.

Yet another feature of the invention is a flexible logic built-in block that can maximize the local logic capability within a logic built-in block, and minimize the global interconnections loading.

These and other features of the invention will be more apparent from the following accompanying drawings and the detailed description of the preferred embodiments.

BRIEF DESCRIPTION OF THE DRAWINGS

FIG. 11A through FIG. 11C are tables showing the configuration of the global signals connected to one of the logic built-in blocks (block H) in the exclusive global interconnection mode of this invention.

DESCRIPTION OF THE SPECIFIC EMBODIMENTS

The presented high-density programmable logic device (PLD) is a CMOS programmable electrically-erasable logic device, that can be programmed by a logic designer to perform various kinds of logic functions. According to the principles of this invention, the device includes a plurality of programmable Logic Built-in Blocks (LBBs) connected by a Global Interconnect Multiplex Matrix (GIMM). As explained in more detail below, the logic built-in block provides more flexibility and capacity for logic mapping and logic allocation. Furthermore, the global interconnect multiplex matrix provides high routeability in most of the applications, while maintaining high speed and small chip size.

Figure 1:
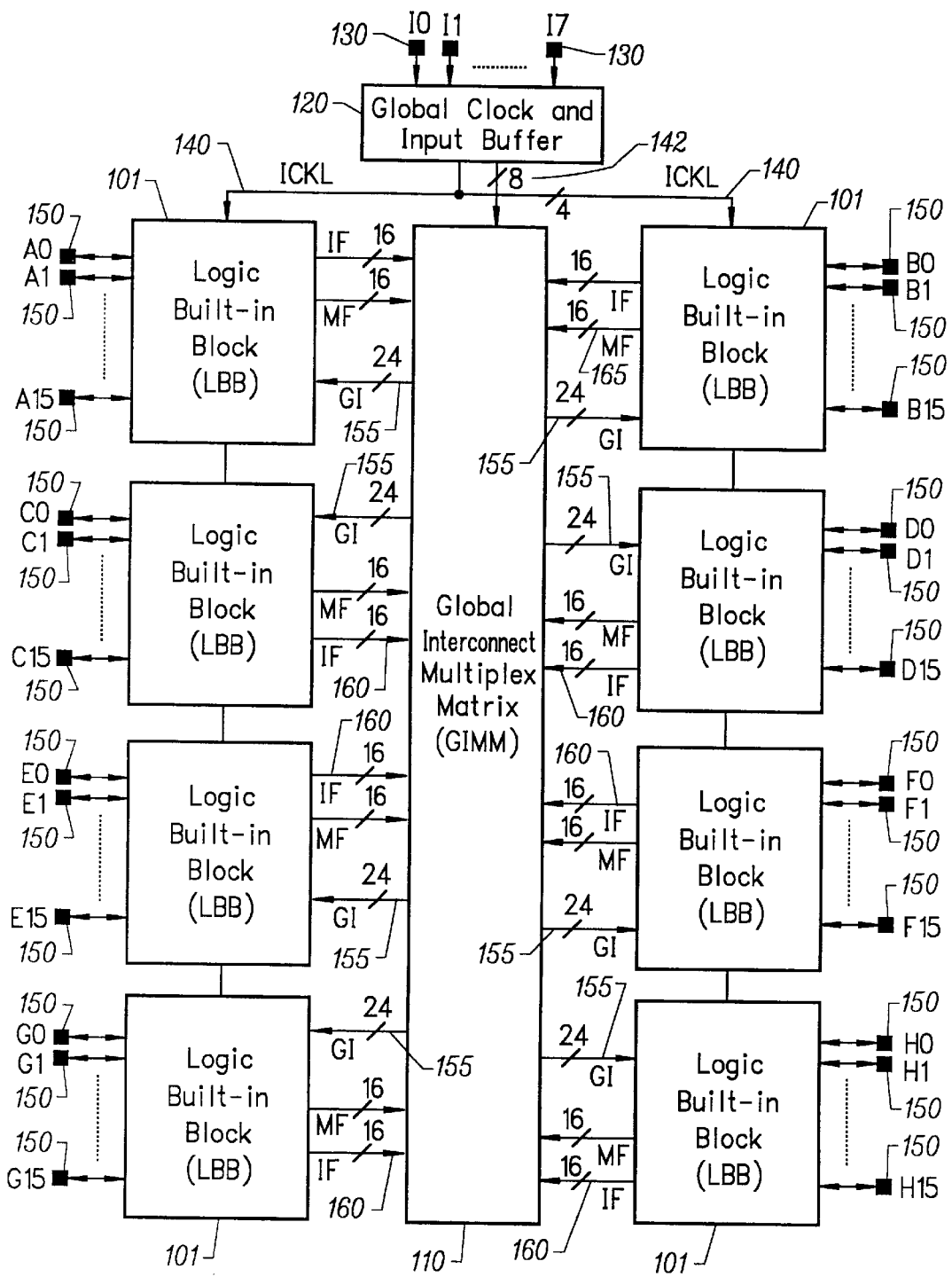
FIG. 1 is a block diagram of an illustrative embodiment of the present invention with a plurality of identical programmable logic built-in blocks interconnected by a programmable global interconnect multiplex matrix.

FIG. 1 shows the block diagram of one embodiment of the high-density programmable logic device of this invention. The device includes a plurality of identical programmable logic built-in blocks LBB-A through LBB-H 101, a programmable global interconnect multiplex matrix 110 and a global clock and input buffer 120. The programmable logic built-in blocks 101 are interconnected through the programmable global interconnect multiplex matrix 110. Each programmable logic built-in block 101 has local feedback paths for local signals and receives signals from other logic built-in blocks 101, through the global interconnect multiplex matrix 110. The global clock and input buffer 120 accepts external dedicated clock signals and direct input signals 130, and generates a group of buffered internal global clocks 140, for device-wide synchronization purposes. It also provides a group of buffered direct input signals 142, for global control purposes. The high flexibility and capacity of the logic built-in blocks 101, along with the high speed and utilization of the global interconnect multiplex matrix 110, allow this embodiment of the programmable logic device to function as either eight independent programmable logic devices, or as one or more monolithic programmable logic devices.

The logic built-in blocks 101 are basic, but flexible functional element of this device. Each logic built-in block contains a number of macro-cells and internal local connections, in order to perform logic functions relatively independently. Besides the local feedback signals, logic built-in blocks 101 receive inputs from external I/O pins 150, and inputs 155 from the programmable global interconnect multiplex matrix 110. Information is exchanged between the logic built-in blocks 101, by output signals 160,165 routed through the global interconnect multiplex matrix 101. To ensure that all the I/Os 150 can be accessed by each logic built-in block 101 of the device, the input feedback signals 160 are also fed into the global programmable interconnect multiplex matrix 110. In this embodiment of the invention, each logic built-in block 101 contains sixteen macro-cells. As described completely below, each macro-cell has a corresponding input output cell connected to an I/O pin 150. Hence, every logic built-in block 101 outputs sixteen global feedback 165 signals and sixteen input feedback signals 160 to the global interconnect multiplex matrix 110. Because each logic built-in block has its own local feedback path, the number of the input signals 150 from the global interconnect multiplex matrix to each logic built-in block is minimized to as low as twenty-four.

There are two levels of interconnect in the device: local interconnect, which is inside each logic build-in block 101, and global interconnect 155, which is provided by the programmable global interconnect multiplex matrix 110. The global interconnect multiplex matrix 110 is a multiplexer matrix and accommodates all the global connections. It serves as a bridge to communicate logic information between programmable logic built-in blocks 101, and enables these logic built-in blocks to work together, to implement a more complex logic function. Through global feedback signals 165, the logic signal generated by one logic built-in block 101 may be sent to the global interconnect multiplex matrix and switched to the other logic built-in blocks 101 to perform more complex logic functions. The global interconnect multiplex matrix 110 also communicates input signals from I/O pins 150. The input/feedback signals 160 utilize the global interconnect multiplex matrix 110 as an input signal distributor, to transfer the external input signals to the logic built-in blocks 101, as required by the specific application.

The device provides eight external dedicated global clock and direct input pins 130 connected to the global clock and input buffer 120. Four of these eight external input signals could be used as either global clocks or direct input signals. The buffered global clocks 140 are connected to all the macrocells, in which the clock distribution circuit combines them with other LBB-wide or local clocks, and offers a versatile clocking scheme for the registers. By this mechanism, synchronous clocking, asynchronous clocking and multi-clocking can be achieved flexibly, through configuration according to the application. When the external clock pins are not used to convey the global clock signals, they can serve as direct input signals. The buffered direct input signals 142 can reach each logic built-in block 101 through the global interconnect multiplex matrix 110. These signals can function as either global control signals or general input signals.

The global interconnect could be implemented in different ways. In the present embodiment, a global interconnect multiplex matrix 110 is used to emulate the 100% global interconnection. All the output signals 150 output from each logic built-in block, as well as the input feedback signals 160 corresponding to each logic built-in block 101, are fed to the inputs of the global interconnect multiplex matrix 110. Through the matrix, the input signals are selected to output to each logic built-in block 101. The selection pattern is in such an optimized mode that the routeability is maximized. This kind of multiplex matrix structure achieves faster speed and less chip size, while maintaining high routeability. Because the logic built-in block structure of this embodiment has internal local feedback paths, the global interconnection is in an exclusive mode such that only the global signals from other logic built-in blocks can be selected as the input signals of a certain logic built-in block. This decreases the number of the multiplexers in the matrix, and further lessens the chip size of the device.

It has been determined that, due to the larger number of the global interconnect signals and larger capacitive load of these signals, the higher the density of a programmable logic device is, the lower the speed of the global interconnect. One major object of this invention is a high-density complex programmable logic device with balanced speed and routeability. As described above, the embodiment of this invention depicted in FIG. 1 has as many as eight logic built-in blocks 101. By utilizing the exclusive global interconnect multiplex matrix 110, and flexible logic built-in blocks 101, delays of interconnect are greatly decreased, while the routeability of the global interconnects remains extremely high. Of course, a different number of logic built-in blocks may be used by those skilled in the art to create alternative high-density complex programmable logic devices as embodiment of this invention without departing from the principles of the invention.

Figure 2:
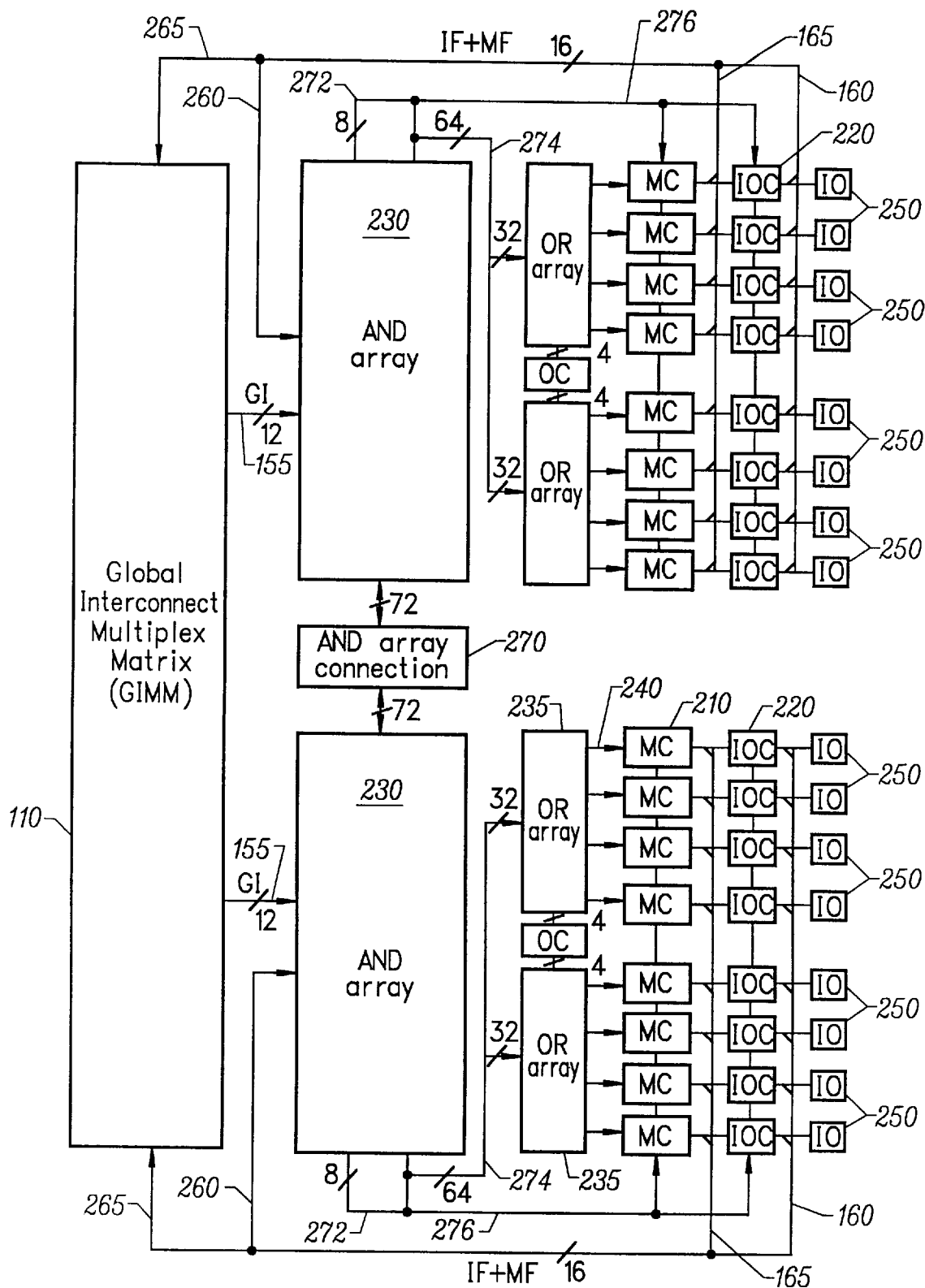
FIG. 2 is a more detailed block diagram of the logic built-in block of this invention and includes AND array, OR array, macrocells and their connects to the global interconnect multiplex matrix and I/O cells.

FIG. 2 is a more detailed block diagram of the logic built-in block 101 of this invention, and shows its major components and how they are put together to form a flexible logic function block. The logic built-in block 101 is generally constructed by a Programmable Logic Array (PLA) feeding a group of sixteen macro cells 210 and sixteen input/output cells 220. A PLA is usually a flexible AND array 230 feeding a flexible OR array 235. There are sixteen sum terms 240 output from OR array, each of which is dedicated to a macro cell 240. The output of each macro cell 210 can either be fed directly back as macro cell feedback signals 165, or drive an input/output cell 220 and send the signal outside the chip through the input/output pin 250 connecting to the input/output cell 220. When an input/output pin 250 of the device is configured as an input pin, the external input signal from this pin is buffered by the input/output cell and the buffered input signal is fed into the device through input feedback signals 160. The macro cell feedback signals 165 and input feedback signals 160 are merged together as IF+MF, which could be fed locally to local logic built-in block through feedback line 260, or global to other logic built-in blocks through feedback line 265 and global interconnect multiplex matrix 110.

To achieve high performance, high flexibility and logic capacity, the AND array and OR array of the embodiment of this invention are divided in sub arrays, which can be programmably connected together. In the embodiment of this invention shown in FIG. 2, the programmable AND array is divided into two sub AND arrays 230. Between them there is a programmable AND array connection bit line 270 of seventy-two bits wide. Each sub AND array 230 has twelve input signals 155 from the global interconnect multiplex matrix 110 and sixteen input signals 260 locally fed back from the local macro cells and input/output cells. So there is a total of twenty-eight input signals for each sub AND array 230. Each sub AND array generates seventy-two product terms 272+274. The size of each sub AND array 230 is 56×72. Of the seventy-two product terms of each sub AND array, sixty-four product terms 274 are used to feed two sub OR arrays 235, or used as local control signals 276 to the macro cells and input/output cells associated with these two OR arrays. Another eight product terms 272 are special global control product terms which are dedicated to the global control signals to the macro cells 210 and input/output cells 220 associated with these two OR arrays 235. Through the programmable AND array connection bit line 270, every couple of corresponding product terms in the two sub AND arrays can be programmed to connect together or disconnect individually. Similarly, the programmable OR arrays connected to the two sub AND arrays are also divided into two sub OR arrays 235. Between the two sub OR arrays, there is also a programmable OR array connection bit line 280 of four bits wide. Each sub OR array 235 receives thirty-two product terms 282 from the corresponding sub AND array 230 as input signals. Each sub OR array outputs four sum terms 284 to drive four macro cells 210. The size of each sub OR array 235 is 32×4. Every couple of corresponding sum terms 284 in the two sub OR arrays 235 of a sub AND array 230 can be programmed to connect together or disconnect individually. In a logic built-in block, there is a total of sixteen sum terms 284 to drive sixteen macro cells 210 respectively.

It is both logical and convenient to build a PLA by connecting one complementary AND array to another complementary AND array. In this kind of array, the propagation delay time is fixed, and independent of logic inputs. The fixed time delay is determined by the total parasitic capacitance of the gates in a column or row. Therefore, the scale of the array greatly affects the speed of the device. Split sub AND arrays 230 and sub OR arrays 235 reduce the scale of the arrays, then reduce the parasitic capacitance of the arrays. This leads to the improvement of the speed performance of the device.

Figure 3A:
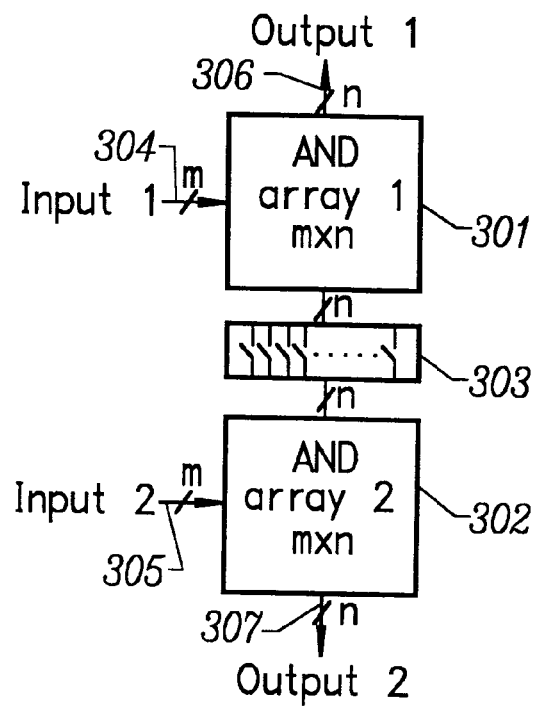
FIG. 3A and FIG. 3B are block diagrams that illustrate the function of the programmable AND array connection bit line, between two sub-AND arrays within a logic built-in block.
Figure 3B:
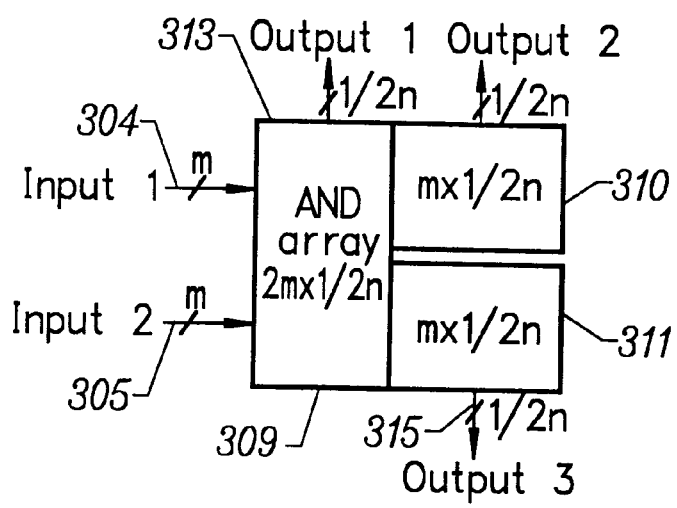
Figure 3C:
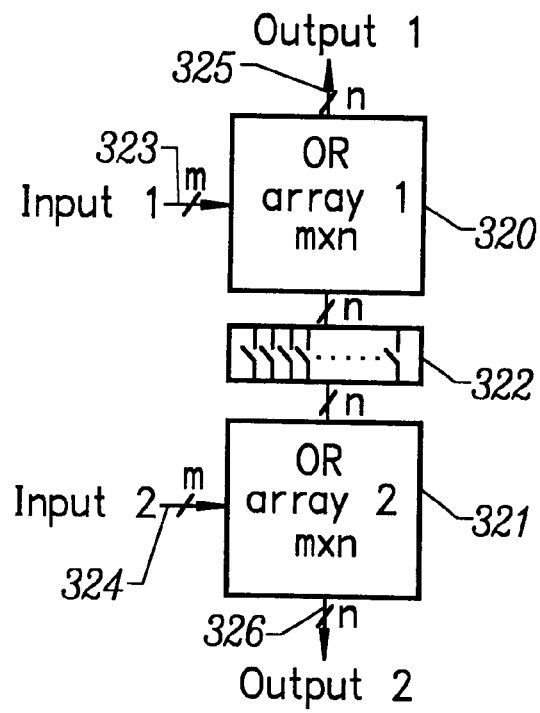
FIG. 3C and FIG. 3D are logic diagrams that illustrate the function of the programmable OR array connection bit line, between two sub-OR arrays within a logic built-in block.
Figure 3D:
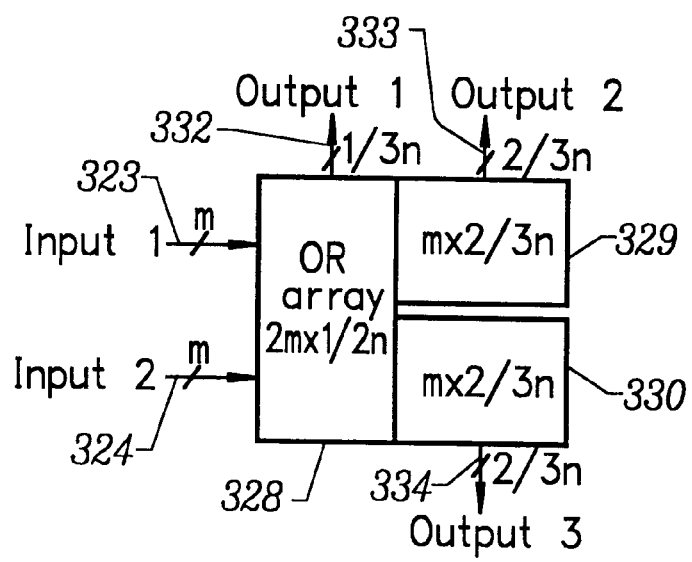

Furthermore, individually programmable connections of the split sub AND arrays and sub OR arrays allow more flexibility and logic capacity. FIG. 3A through FIG. 3D illustrates the function of sub AND arrays and sub OR arrays and their programmable connections. FIG. 3A shows two sub AND arrays 301 and 302 with a programmable AND array connection bit line 303. Each sub AND array 301 or 302 has M input signals 304 or 305 and N output signals 306 or 307. When all the bits of the programmable AND array connection bit line 303 are programmed to OFF state, the two sub AND arrays 301 and 302 function independently as two separate AND arrays. Each output of 306 or 307 is a product term of any combination of the corresponding M input signals 304 or 305. If M input signals is not enough to implement a logic in a sub AND array 301 or 302, the programmable AND array connection bit line 303 can be programmed to connect the two corresponding product terms in the two sub AND arrays 301 and 302. These two product terms are merged to a new one with an extended input signal of 2M, which increases the logic capacity of the AND array. FIG. 3B shows that half of the programmable AND array connection bit line 303 is programmed to ON state and another half remains in OFF state. The merged product terms form an AND array 309 with 2M input signals, 304 and 305, and ½ N output signals 313. Each output signal of 313 is a product term of any combination of the 2M input signals 304 and 305. The disconnected AND arrays 310 and 311 retain their independent M inputs 304 and 305, and independent ½ N outputs 314 and 315 respectively. Each output signal 314 and 315 is a product term of any combination of the corresponding M input signals 304 or 305. By switching all the bits of programmable AND array connection bit line to the OFF state, the AND array in the FIG. 3A can implement a total of 2N product terms of M maximum input signals. If all the bits of the programmable AND array connection bit line are programmed to ON state, it can implement a total of N product terms of 2M maximum input signals. The more product terms there are, the more logic the device can implement, and the more flexible the device is. On the other hand, the more a product term contains input signals, the more logic capable the device is. So the structure of the sub AND arrays and their programmable connection of this embodiment of the invention make the flexibility and the capacity of the device programmable according to the applications.

Similarly the OR array structure of this embodiment of the invention has the same features of flexibility and capacity as those of the AND array described above.

Figure 4:
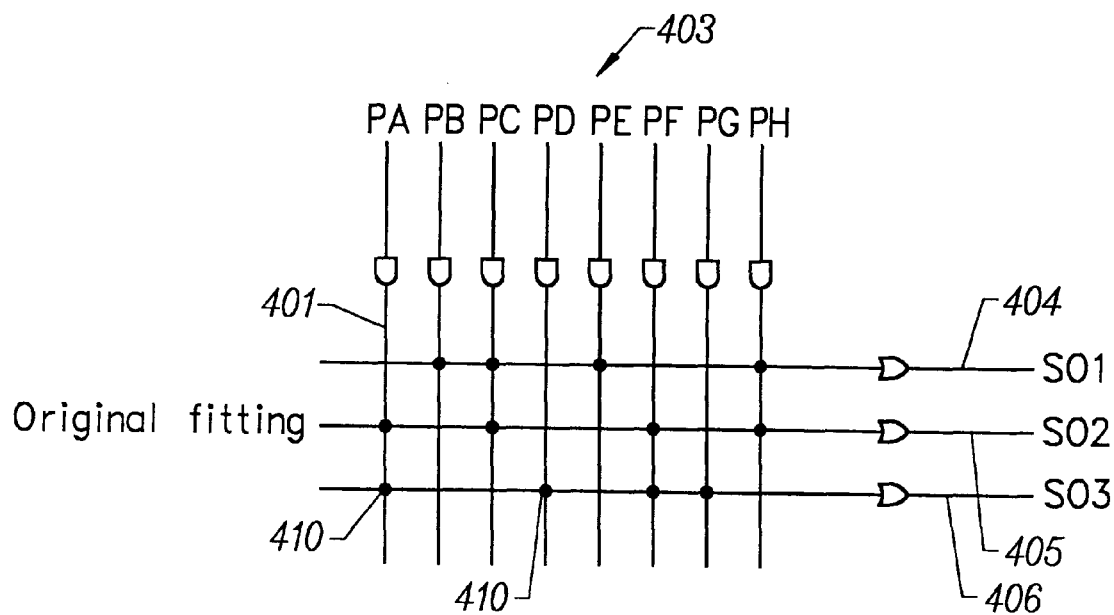
FIG. 4 is a schematic diagram that illustrates the logic re-fitting ability of the programmable OR array.
Figure 4:
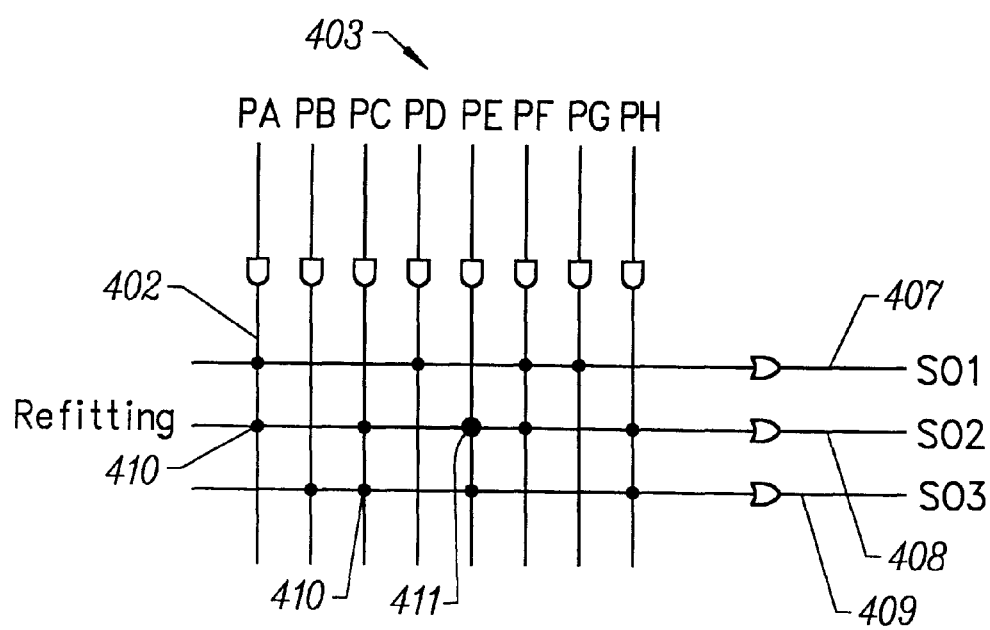

Another feature of this embodiment of the logic built-in block of the invention is the use of programmable OR array instead of fixed OR gates. This fully programmable OR array structure allows dynamic and precise logic allocation which minimizes the waste of logic resource and increases the re-fitting ability of the device. The only limitation in re-fitting the modified designs is the total capacity of the device. The refitting will always be successful as long as there are enough gates available to fit the logic. The additional benefit of the programmable OR array is that the PLA product terms can be shared across multiple outputs. This product sharing capability of the PLA increases the effective density of the device. FIG. 4 shows a simple example of a programmable OR array and its benefits. The example programmable OR array has eight input signals (product terms from a PLA structure) PA to PH 403 and generates three sum terms SO1 404, SO2 405 and SO3 406. The black dots 410 located at the intersections of the input lines and output lines indicate that the corresponding sum term contains these input signals. So array 401 represents a logic implementation as: SO1=PB+PC+PE+PH, SO2=PA+PC+PF+PH and SO3=PA+PD+PF+PG. Suppose this is an original fitting of a certain logic design. Now the design needs some modifications: swapping SO1 and SO3, and adding an input signal PE to SO2. Array 402 shows the logic implementation of the modified design. The refitting of the design has no limitation as long as the logic of the sum terms SO1 407 to SO3 409 is in the scope of the input signals 403 (from PA to PH). The arrays 401 and 402 also show the input signals (product terms) sharing capability across the multiple outputs. For example, in array 401, PA is shared by SO2 and SO3, PC is shared by SO1 and SO2, PF is shared by SO2 and SO3 and PH is shared by SO1 and SO2. If this logic is implemented in a fixed OR mechanism, four more duplicated input signals or product terms are required because of logic un-sharing ability.

Figure 5:
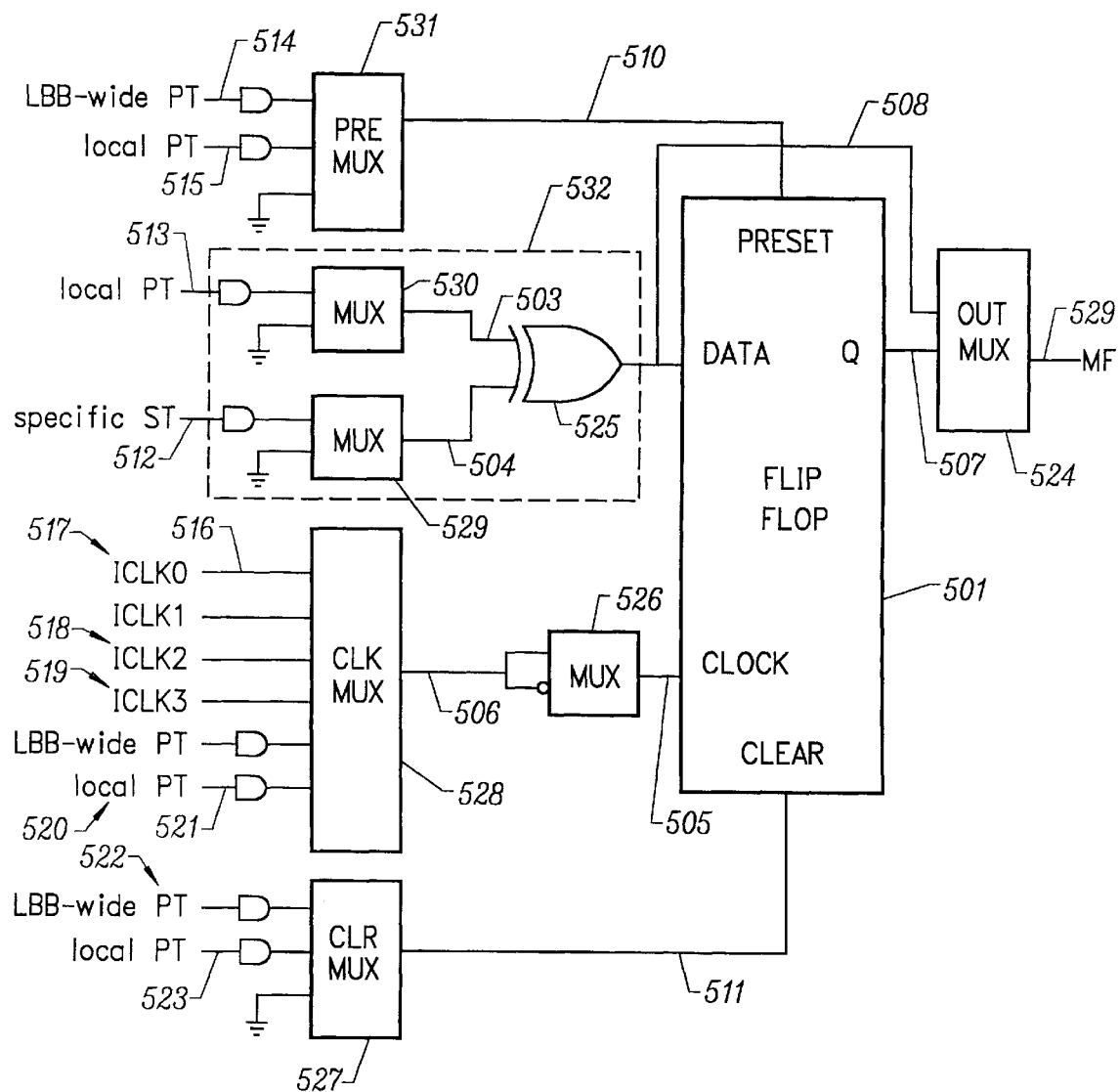
FIG. 5 is a more detailed block diagram of the macrocell of this invention.

FIG. 5 shows the detailed block diagram of one embodiment of the macro cell of this invention. The macro cell usually receives combinational logic output signals from the PAL array or PLA array connecting to it and generates the sequential logic according to the application requirements. As described above, the embodiment of the logic built-in block employs a fully programmable OR array. So in this embodiment of the macro cell as illustrated in FIG. 5, no logic allocation facilities are required, and the structure of the macro cell becomes relatively simple. The core part of the macro cell is a register 501 with a data input terminal DATA, a data output terminal Q, a clock input terminal CLOCK, an asynchronous preset control terminal PRESET and an asynchronous reset control terminal CLEAR. The input signals to the register 501 are driven by a group of multiplexers, and the output drives a multiplexer. The output selection of the multiplexer is controlled by the configuration of the macro cell. Each configuration of the macro cell determines a specific logic function of the macro cell. Clear multiplexer 527 receives a local product term 523, a logic built-in block wide product term 522 and a ground signal, and feeds output control signal 511 to the asynchronous reset control terminal CLEAR. Preset multiplexer 531 receives a local product term 515, a logic built-in block wide product term 514 and a ground signal, and feeds output control signal 510 to the asynchronous preset control terminal PRESET. The buffered four global clock signals ICLK0 516, ICLK1 517, ICLK2 518 and ICLK3 519 are fed to the input terminal of clock multiplexer 528. Besides these global clock signals, the clock multiplexer 528 also receives a local product term 521 and a logic built-in block wide product term 520. It feeds its output signal 506 to the polarity multiplexer 526 which selects the polarity of the clock, and feeds an output signal 505 to the clock input terminal CLOCK. The combinational logic generated by the PLA is represented by local product term 513 or the specific sum term 512 associated with this macro cell. These two input signals are fed to multiplexers 530 and 529 respectively. The output signals 503 and 504 of these two multiplexer are then fed to exclusive OR gate 525. The output signal 502 of the exclusive OR gate 525 drives the data input terminal DATA of the macro cell. It also drives one input terminal 508 of the output multiplexer 524 for the purpose of bypassing the sequence logic. Another input terminal 507 of the output multiplexer 524 is connected to the data output terminal Q of the macro cell 501 to output the sequence logic.

The exclusive OR gate 525 along with the multiplexers 529 and 530 (the structure in the dash line rectangle of 532) of this embodiment has some flexible features. First, it can select the input data of the register 501 between the combinational local product term 513 and specific sum term 512, and control its polarity. By configuring multiplexer 529 or 530 to select the ground signal, the exclusive OR gate 525 outputs the logic of local product term 513 or specific sum term 512. By configuring the AND array to set local product term 513 to logic "1" and configuring multiplexer 530 to select it, the exclusive OR gate 525 outputs inverted version of the specific sum term 512. In the same way, the inverted version of the local product term 513 can be also obtained at the output terminal of exclusive OR gate 525. If both local product term 513 and specific sum term 512 are configured to be selected at same time by multiplexer 530 and 529, the exclusive OR gate will output an exclusive OR logic of these two signals. Thus, via the output multiplexer 514, the embodiment of this logic macro cell of the invention may output either a combinational or a sequential signal with a configurable polarity. Second, the exclusive OR gate 525 in the structure 532 can simplify the carry logic when the macro cell is used to construct a synchronous binary counter. In a synchronous binary counter, the data input of the ith register is an exclusive OR logic of the output of the ith register and the AND logic of the outputs of 1 to (i−1)th registers, i.e., $D(i)=Q(i) \oplus [Q(1)Q(2) \ldots Q(i-1)]$. If local product term 513 is configured as feedback of Q(i) and specific sum term 512 as the AND logic of Q(1) to Q(i−1), the binary counter is effectively implemented. Third, the structure 532 helps to extend the configuration of the register type. In this embodiment, the basic structure of the register 501 is a simple D type flip-flop. It can be easily configured to another type of register, such as T type flip-flop, JK type flip-flop, RS type flip-flop and E (enable) type flip-flop, with the help of structure 532.

Another feature of the embodiment of this macro cell of the invention is flexible multi-level control signals. As described above in FIG. 2, part of the AND array is dedicated to the generation of control product terms that provide a universal control mechanism for the macro cells and input/output cells. The inputs of this control AND array are the same as those of the other AND arrays. The control product terms can be any AND Boolean logic of any combination of local feedback signals and the signals from the global interconnect multiplex matrix. There are eight universal control product terms 272 (FIG. 2) in each logic built-in block. These eight product terms are shared by all the macro cells and the input/output cells associated with this AND array, they are referred to as logic built-in block wide product terms (LBB-wide PT). Apart from these global control product terms, other product terms, which are fed to sub OR arrays, can also be used as the control signals of the macro cells and the input/output cells. These product terms offer the individual control to associated macro cells and input/output cells, they are defined as local product terms (local PT). This control mechanism allows the asynchronous reset, asynchronous preset and output enable signals of the macro cell and input/output cell to be controlled by a wide range of signals from device wide global through logic built-in block global to local, according to the logic design application. This flexible multi-level control mechanism greatly enhances the flexibility and logic capability of the device.

In addition, the logic built-in block wide product terms and local product terms are also used as one of the clock sources of the macro cell and the input/output cell to enrich the clocking configuration. In the embodiment of this macro cell shown in FIG. 5, the register 501 can be clocked from any one of six clocking sources, through the selection of the clock multiplexer 528. Four of the clock sources ICLK0 through ICLK3 (516 through 519) are low-skew, device-wide clock networks, designed to preserve the integrity of the clock signal by reducing skew between the rising and falling edges. All these clock sources are from external sources and are driven by a group of internal global clock buffers. The other clock sources are a logic built-in block wide product term 520 and a local product term 521. These clock sources can be configured as individual or logic built-in block wide product term equations of up to fifty-six input signals available inside a logic built-in block, and can be used as asynchronous clocks. This multi-level clocking scheme gives the designer great flexibility to chose clock sources in logic design.

Figure 6:
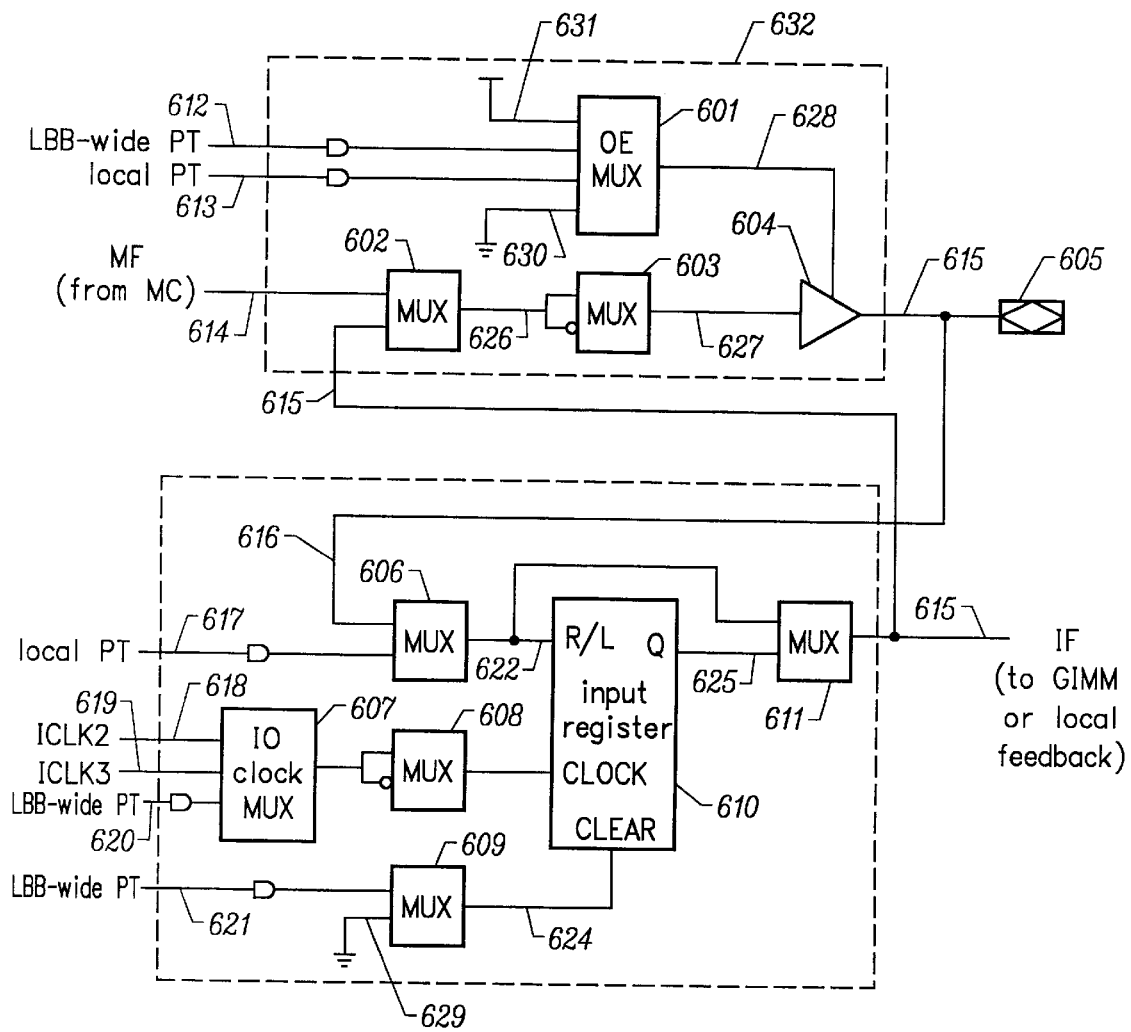
FIG. 6 is a more detailed block diagram of the input/output cell of this invention.

FIG. 6 shows the detailed block diagram of one embodiment of the input/output cell of this invention. The main function of the input/output cell is to effectively manage signals. There is an input/output pin 605 coupling an input/output cell. In this embodiment, the input/output cell can be divided in to two parts. The core element of the first part is a tri-state buffer 604. Other elements include an output multiplexer 602, an output polarity multiplexer 603 and an output enable multiplexer 601. This part of the cell is mainly responsible for output functions. The output signal can be either an output from the associated macro cell MF 614 or the signal 615 from input part. These two output signals are fed to the output multiplexer 602. The output of the output multiplexer 602 is connected to the polarity multiplexer 603 for the output polarity configuration. The polarized output signal 627 is fed to the tri-state buffer 604 which is directly connected to the input/output pin 605. The states of the tri-state buffer 604 are controlled by the output enable signal 628 which can be configured to a logic ground 630, a logic high 631, a local product term 613 or a logic built-in block wide product term 612 via the output enable multiplexer 601. The core element of the second part of the input/output cell is a input register 610 with a data input terminal R/L, a data output terminal Q, a clock input terminal CLOCK and a asynchronous reset terminal CLEAR. This register can be configured to a D type flip-flop register or a latch according to the application. Similar to the macro cell described above, this part of the cell also includes a clock signal multiplexer 607, a clock polarity multiplexer 608, an input data multiplexer 606, a reset multiplexer 609 and an output multiplexer 611. This part of the cell controls the input and buried register function of the device. The input data signal 622 can be selected from either the direct input signal 616 on input output pin 605 or a local product term 617 via the input data multiplexer 606. The input data signal 622 is fed to the data input terminal of the input register 610 to generate a registered input signal 625. If a non-registered input signal is required, the input data signal 622 can bypass the input register 610 and connect to the output multiplexer 611 directly. The resulting signal 615 serves as both the input feedback IF to the global interconnect multiplex matrix or to the local feedback, and the output signals to one of the input signals to output multiplexer 602. The asynchronous reset terminal of the input register 610 is controlled solely by a logic built-in block wide product term 621. If the reset multiplexer 609 is configured to select logic ground 629, the reset function of the input register 610 is masked. The clock sources of the input register 610 are the low-skew, device-wide global clocks ICLK2 618, ICLK3 619 and a logic built-in block wide product term 620. Via the clock multiplexer 607 and polarity multiplexer 608, the clock input terminal of the input register 610 can be driven by a global synchronous clock, or by a logic built-in block wide asynchronous clock with a configurable polarity.

When the embodiment of this input/output cell is configured as an output buffer, the output signal can come from either the output MF 614 of the associated macro cell or the output 615 of the output multiplexer 611. When selecting the output 614, it is a normal output buffer. However, if the output 615 is selected, the input part of the input/output cell of this embodiment is used as a extended macro cell of the device, and the input register 610 serves as a buried register of the device. The logic of the local product term 617 can be fed to or bypassed the input register 610, and output to the input/output pin 605. On the other hand, when the embodiment of this input/output cell is configured as an input buffer, the input signal goes from the input/output pin 605, through the signal 616, to the data input terminal of the input register 610, or bypasses the input register 610. The registered or non-registered version of the input signal 615 is then sent to the global interconnect multiplex matrix or to the local feedback. When the embodiment of this input/output cell is configured as a bi-directional input/output buffer, the input part and the output part of the cell are used simultaneously. Under this configuration, the output signal comes only from the output 614 of the associated macro cell, and the input signal from external pin 605 goes through or bypasses the register 610 to the local feedback or the global interconnect multiplex matrix. Other configurations are not allowed. The tri-state logic is controlled by the logic built-in block wide product term 612, or by the local product term 613, through the configuration of output enable multiplexer 601. If the input/output pin 605 is not used in an application, the input register 610 of this embodiment of the input/output cell can be used as a buried register for the internal logic implementation. The registered or non-registered version of the local product term 617 can be fed to the local feedback or the global interconnect multiplex matrix through 615.

In summary, the embodiment of the input/output cell of the invention shown in FIG. 6 can be configured as an input buffer with or without a register, or an output buffer feeding a output signal from the associated macro cell or buried register to the external output pin, or a bi-directional input/output buffer with flexible output enable control, or a totally buried macro cell for the internal logical implementation if the corresponding input/output pin is not used. These features along with its multi-level controllability and flexible clocking scheme enable the embodiment of the input/output cell to provide more logic capacity and flexibility for the application of the device.

Figure 7A:
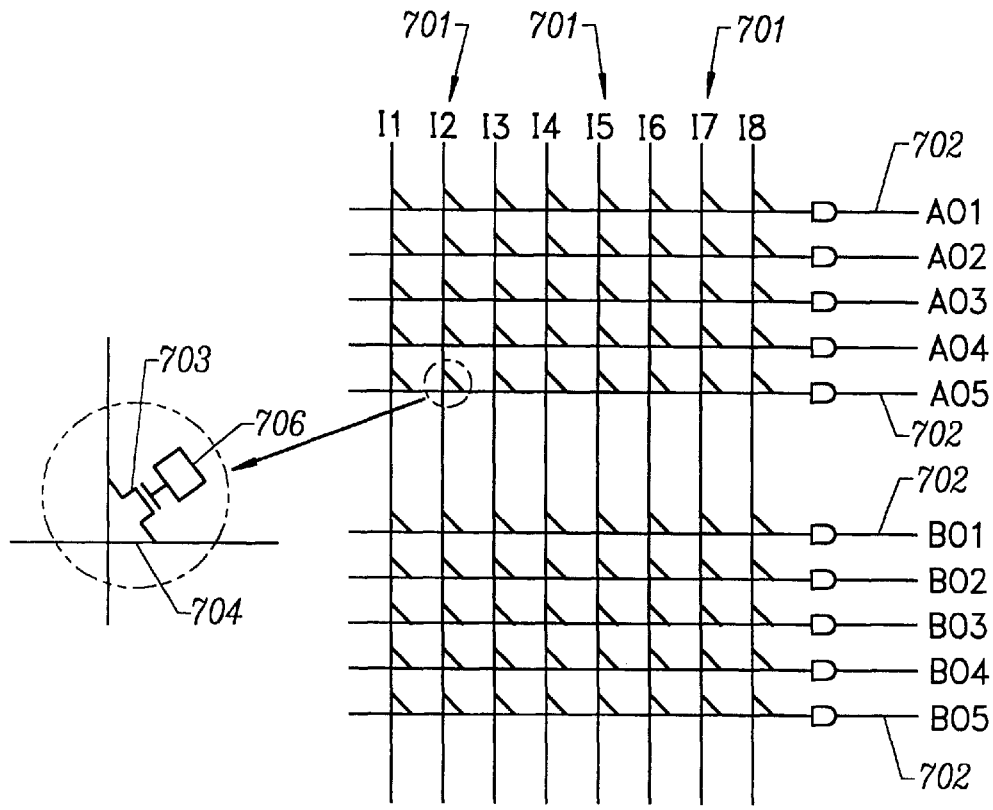
FIG. 7A is a schematic diagram that illustrates the prior art full-cross point programmable interconnect array (PIA) structure.
Figure 7B:
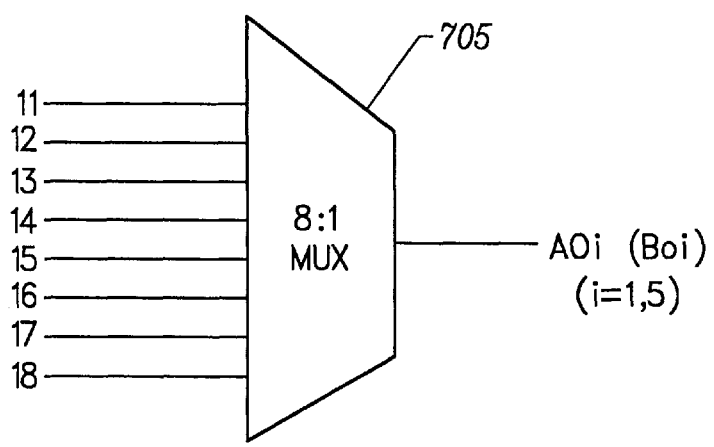
FIG. 7B illustrates an output of FIG. 7A.

The present invention applies a multiplexer based global interconnection facility, called Global Interconnect Multiplexer Matrix 110 (FIG. 1), instead of full-cross point Programmable Interconnect Array (PIA) in the preferred embodiment of high density programmable logic device shown in FIG. 1. In some of the prior programmable logic devices, 100% programmability of the global signal interconnection is obtained by providing a programmable interconnect array in which every bit line intersects every global input signal, and by providing a programmable element such as EEPROM cell at every intersection. With these programmable elements, the user can connect any selected global input signals to any selected bit lines. FIG. 7A shows an example structure of the full-cross point global interconnect array mentioned above. The example array has eight global input signals I1–I8 701 and two groups of five output signals (bit lines) AO1–AO5 (BO1–BO5) 702. By providing a programmable element 703 at every intersection 704, any one of the global input signals 701 can be connect to any one of the output signals 702 under any kind of routing situation, through the configuration of the programmable element. Every output signal of 702 can be an equivalent to a 8:1 multiplexer 705 shown in FIG. 7B, and the whole example array functions same as an array consisting of two groups of five 8:1 multiplexers 705.

However, using the programmable element at every intersection of global inputs signals and bit lines leads to an undesirable decrease in speed caused by the capacitive loading of the elements on the global input signals and the output signals. Furthermore, only a small fraction of the total number of the programmable elements is actually used in any particular design. This results in a very large redundancy and large chip size.

This speed reduction and redundancy can be eliminated by a multiplexer based interconnection facility used in present invention in which a programmable element is not positioned at every intersection. Instead, only the limited global input signals are selectively connected to the input of the multiplexers, the outputs of the multiplexers are connected to the bit lines, and the multiplexers can be programmatically controlled by the user.

In this structure, the routeability of the global input signals to the bit lines conflicts with the size of the multiplexer. To ensure that the user has maximum flexibility in routing the global input signals to the bit lines, the multiplexers should have as many inputs as possible. However, to keep the chip size as small as possible, the multiplexers should have as few inputs as possible. In an optimized connection pattern, this multiplexer based interconnection structure can emulate the routeability of full-cross point PIA while maintaining high speed and small chip size.

Figure 8A:
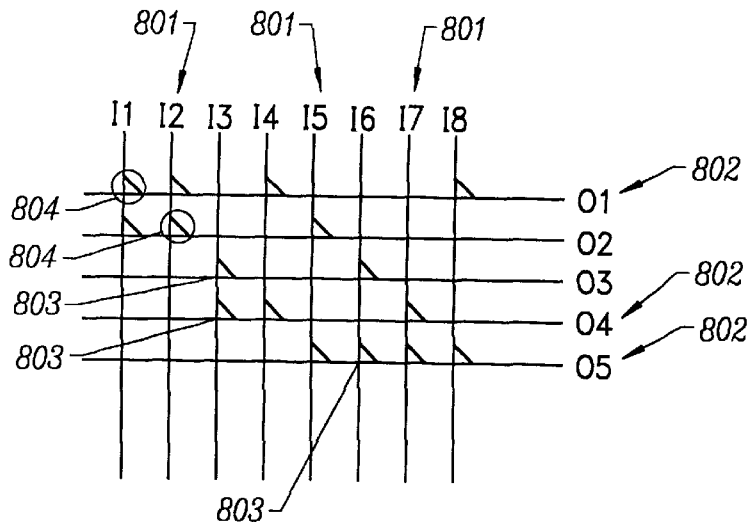
FIG. 8A and FIG. 8B are example schematic diagrams that illustrate some interconnection patterns affecting the routeability in a multiplexer based global interconnections.
Figure 8B:
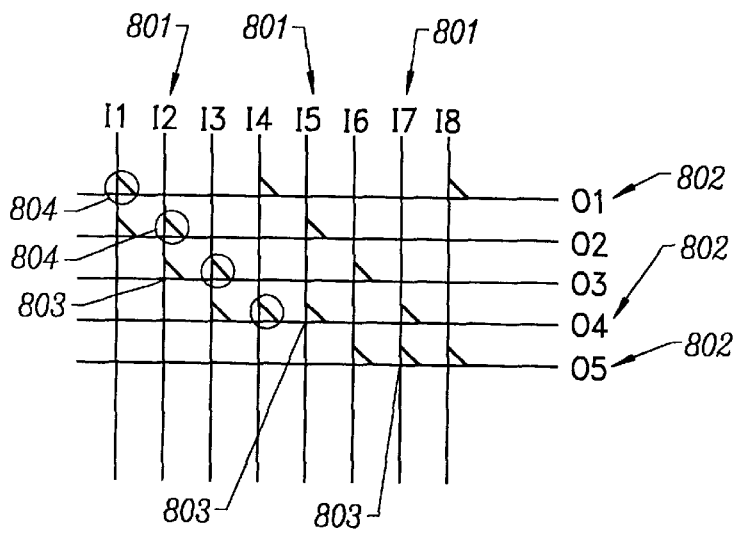

Different connection patterns between the global input signals and the multiplexers affect the routeability a lot. FIG. 8A through FIG. 8B give two typical such patterns. In FIG. 8A, the global input signals I1–I8 801 are connected to the output signals O1–O5 802 in a way that every global input signal has only two paths to the outputs. Intersections 803 indicate the connection pattern. The intersections with a circle 804 represent that the corresponding global input signal is selected to connect to the corresponding output. In the connection pattern showing in FIG. 8A, the global input signals I1 and I2 feed the same set of multiplexers O1 and O2. If the global input signals I1 and I2 are selected to connect to O1 an O2 respectively, the connections of I1 and I2 are unchangeable, which results in lower routeability. Similarly in FIG. 8B, the global input signals I1–I8 801 are also connected to the output signals O1–O5 802 in such a way that every global input signal has only possible two paths to the outputs. Intersections 803 indicate the connection pattern. The intersections with a circle 804 represent that the corresponding global input signal is selected to connect to the corresponding output. In the connection pattern showing in FIG. 8B, the connections of the global input signals I1, I2, I3 and I4 form a cyclic chain. If the global input signals I1, I2, I3, I4 are selected to connect to O1, O2, O3 and O4 respectively, the connections of I1, I2, I3 and I4 are unchangeable, and the global input signal I5 will never have a chance to be routed to any output.

Figure 9A:
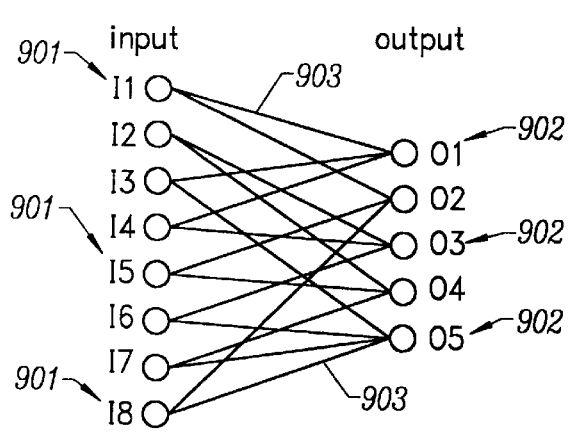
FIG. 9A through FIG. 9C are example schematic diagrams that illustrate the interconnection pattern of this invention that maximizes the global routeability.
Figure 9B:
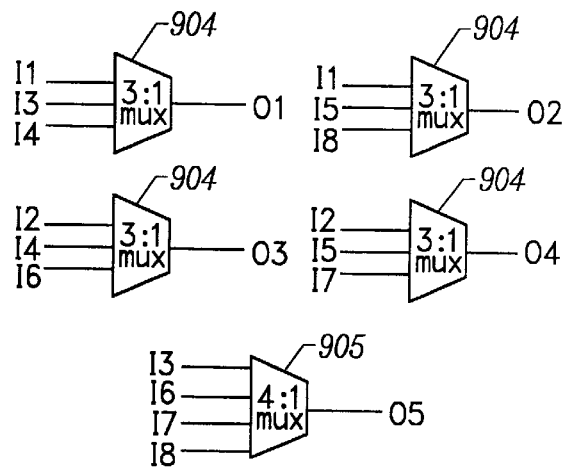
Figure 9C:
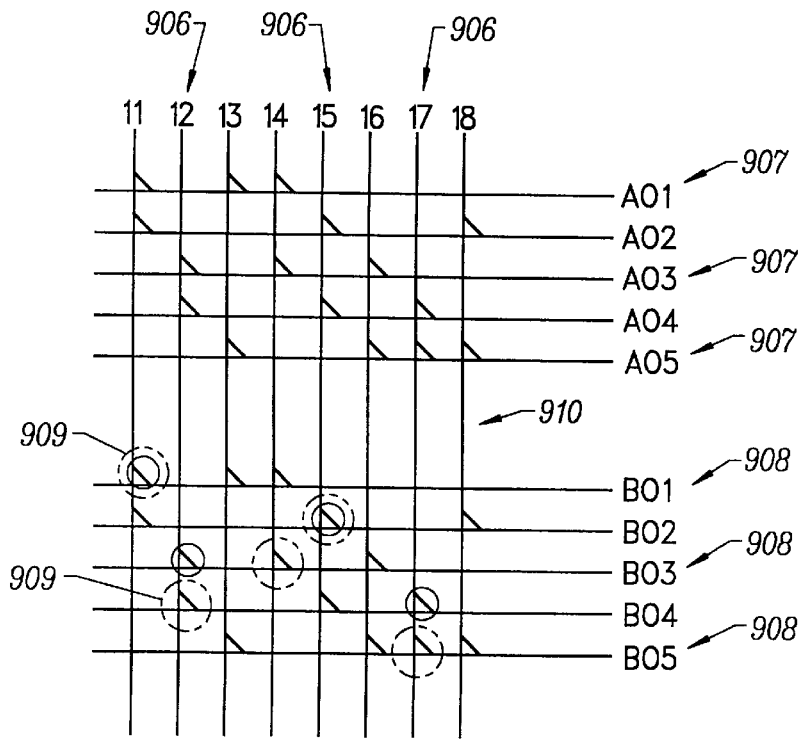

Above examples reveal that the connection pattern with two or more global input signals feeding the same set of outputs or the connection pattern forming a cyclic chain will lower the global signals routeability. In other words, to obtain an optimized connection pattern, the connections of the global input signals to the outputs should be even. FIG. 9A through FIG. 9C show an example of the connection pattern in which the global input signals evenly populate the outputs. In this example, the basic structure is similar to that showing in FIG. 8A through FIG. 8B. There are eight global input signals and five output signals. Every global input signal has only two possible paths to the outputs. The only difference is the patterns of the connection. FIG. 9A shows the connection pattern in another way that the circles 901 represent the global input signals, the circles 902 represent the outputs, and the segments 903 represent the connections between them. The connections comply with the even principle discussed above. FIG. 9B shows the implementation of this evenly populated connections by using four 3:1 multiplexers 904 and one 4:1 multiplexer 905. FIG. 9C further shows the connections in the intersection diagram. In this diagram, the connection pattern is applied in a case that there are two groups of outputs AO1–AO5 907 and BO1–BO5 908. These two groups of outputs share the same set of global input signals I1–I8 906. The patterns of two groups are the same. Suppose five global input signals are needed to connect to the second output group BO1–BO2, and at first, I1, I5, I2 and I7 have been assigned to connect to BO1, BO2, BO3 and BO4 respectively. If I4 is the fifth global input signal to be connect to the output, no direct connection can be made because the feeding pattern of I4 is conflict with the connections have be made, and I4 is blocked. But under this optimized even connection pattern, I4 has the possibility to be routed out. The connections that have been assigned, and that block I4, are changeable and a space is possibly obtained by shifting the blocking signals. For example, in FIG. 9C, if I2 is re-assigned to BO4 and I7 is re-assigned to BO5, BO3 is now free for the assignment, and I4 can be assigned to BO3. In the diagram, solid circles around the intersections present the connection assigned before the changes, and dash circles around the intersections indicate the connection re-assigned after the changes.

Figure 10A:
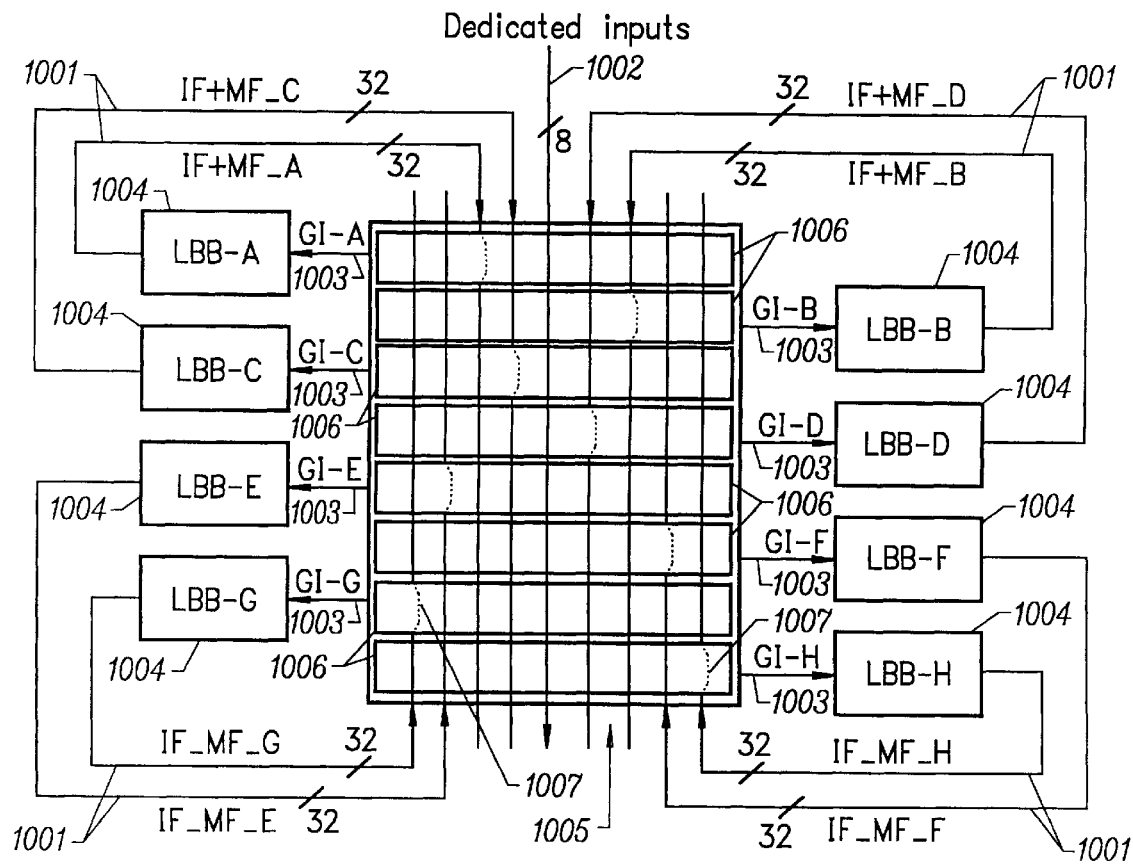
FIG. 10A and FIG. 10B are simplified block diagrams that illustrate the exclusive global interconnection mode of the global interconnect multiplex matrix of this invention.

Back to the embodiment of high density programmable logic device of the present invention, FIG. 10A shows the structure of eight logic built-in blocks 1004 (labeled as LBB-A to LBB-H) with a global interconnect multiplex matrix 1005. The global interconnect multiplex matrix 1005 receives thirty-two signals 1001 (sixteen input feedback signals and sixteen global feedback signals, labeled as IF+GF-A to IF+GF-H) from each logic built-in block 1004, and eight dedicated input signals 1002 from the external. It feeds twenty-four outputs 1003 (labeled as PI-A to PI-H) to each logic built-in block. As shown in FIG. 10A, the global interconnect multiplex matrix consists of eight banks of sub multiplexer matrixes 1006 corresponding to eight logic built-in blocks. Because, as described above, the logic built-in block 1004 in this embodiment contains enough local feedbacks (including all the input feedbacks), so that there is no need to route the global feedbacks and input feedbacks to the same logic built-in block 1004. The sub multiplexer matrixes 1006 are formed to accept the global input signals in an exclusive mode. The dash segment 1007 in the sub multiplexer matrix 1006 indicates the input signals from the corresponding logic built-in block 1004 are excluded to this sub matrix 1006. Each sub matrix 1006 has the same number of global input signals 1001, but different contents.

Considering the exclusive connection mode of this embodiment, there are 232 global input signals (224 global feedback signals 1001 and 8 dedicated inputs 1002) from the logic built-in block 1004 to every sub multiplexer matrix 1006, and there are 24 output lines 1003 from each sub multiplexer matrix 1006 to its corresponding logic built-in blocks in this embodiment. To assure adequate routeability of the high density programmable logic device of this embodiment, each global input signal 1001 and 1002 must have at least three different paths through the global interconnect multiplex matrix. The number of output lines, the number of input signals and the routeability factor determine the minimum size of the programmable multiplexers of the global interconnect multiplex matrix. Specifically, Multiplexer size=(number of input lines)×(routeability factor)/
number of multiplexers=(232×3)/24=29.

Figure 10B:
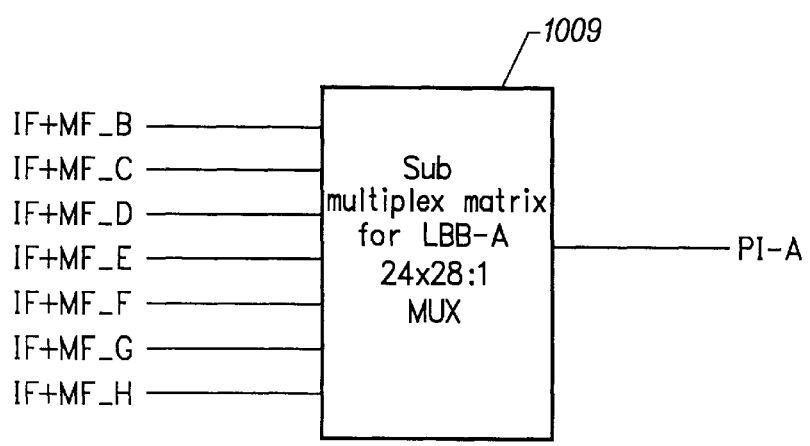

Hence, in this embodiment, the global interconnect multiplex matrix 1005 includes eight banks of twenty-four programmable 29:1 multiplexers. Through this structure, the global interconnect multiplex matrix 1006 in conjunction with the local feedback signals within a logic built-in block provides full global connectivity where each programmable logic built-in block has access to all the global and the local signals. Due to the exclusive connection pattern, the input signals to each sub multiplexer matrix 1006 are different. FIG. 10B gives an example of a sub multiplexer matrix corresponding the first logic built-in block (LBB-A), which includes twenty-four 29:1 multiplexers. This sub multiplexer matrix receives the global feedback signals and the input feedback signals from other logic built-in blocks: LBB-B to LBB-H, and the dedicated inputs from external, and feeds twenty-four output signals to the logic built-in block LBB-A. The local feedback signals and input feedback signals from the logic built-in block LBB-A are sent to LBB-A through its local feedback paths. The sub multiplexer matrixes corresponding to other logic built-in blocks have the same structure and exclusive feature of the sub matrix show in FIB. 10B.

Figure 11A:
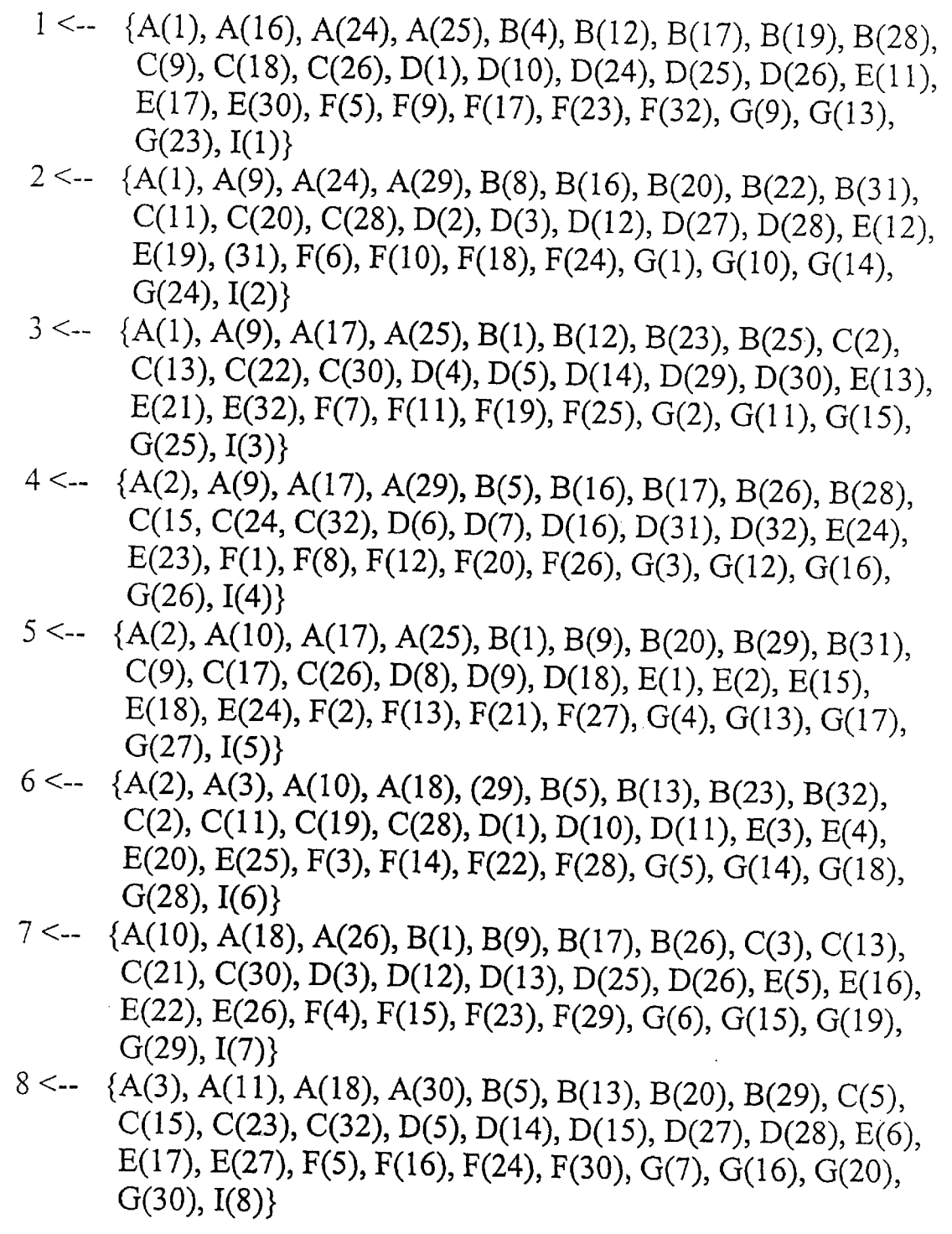
Figure 11B:
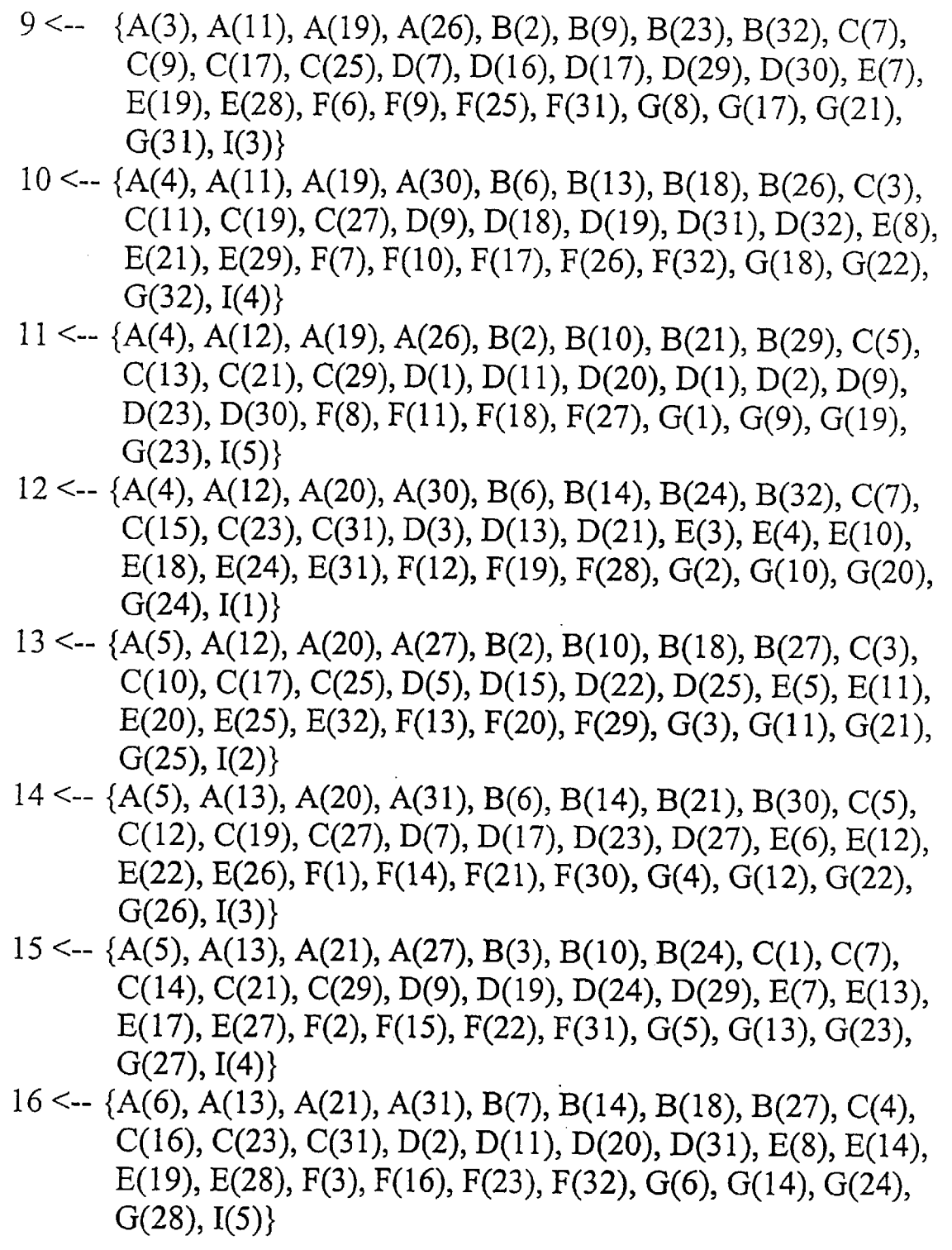
Figure 11C:
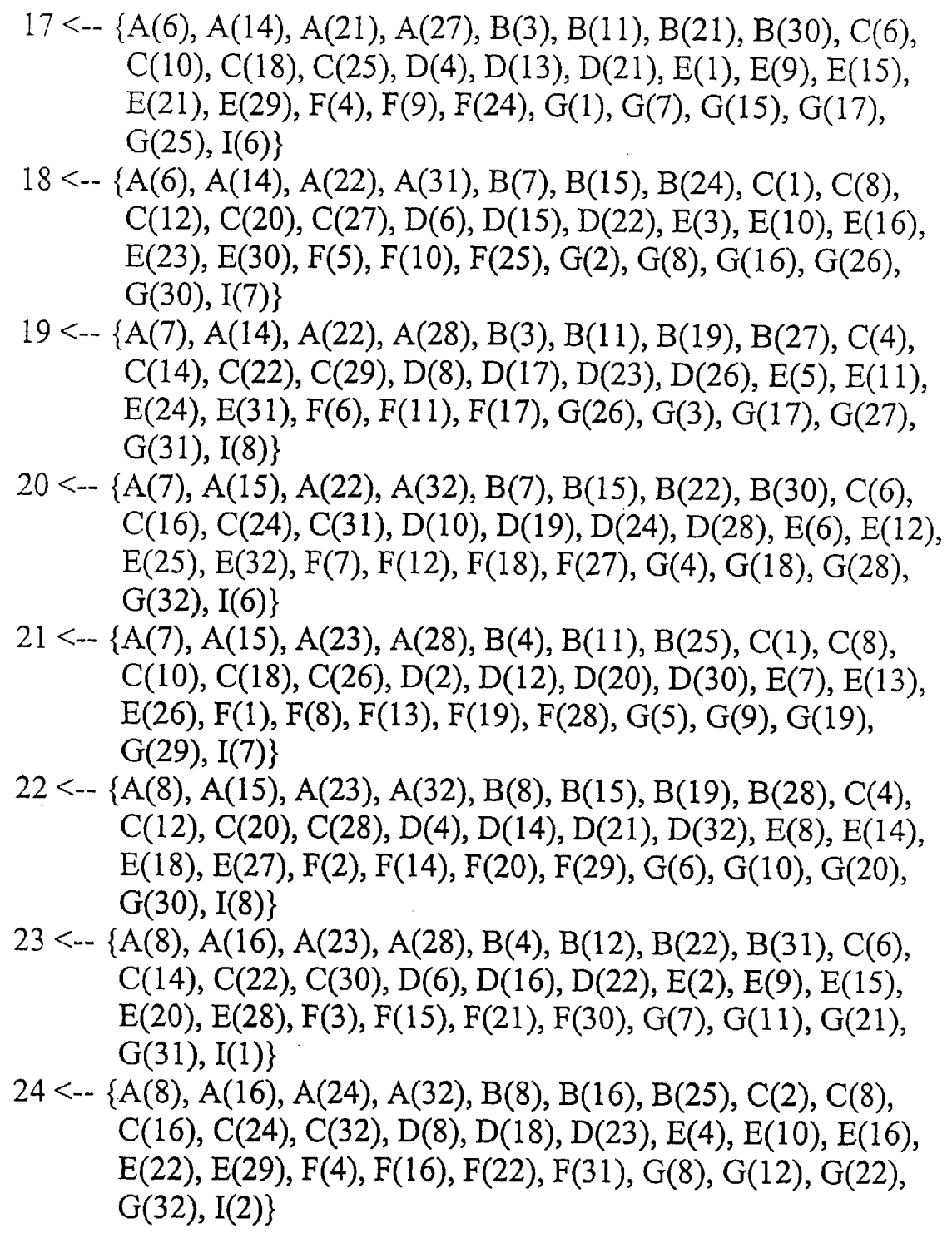

FIG. 11A through FIG. 11C illustrates one embodiment of the connection pattern of one sub multiplexer matrix 1006 (FIG. 10) in the global interconnect multiplex matrix 1005 (FIG. 10) suitable for use with the high-density programmable logic device of this invention. As described above, the eight programmable logic built-in blocks are represented as LBB-A to LBB-H. The thirty-two global input signals from each logic built-in block are numbered from 1 to 32. Thus, the global input signals from logic built-in block X are represented by X1 to X32. For example, the global input signals from logic built-in block are represented by A1 to A32. The twenty-four output signals fed to each logic built-in block, also the output lines of twenty-four multiplexers in a bank, are numbered from 1 to 24. The global signals in the braces ({}) mean that all these signals are connected to the input lines of the corresponding multiplexer, and only one of these signals is selected at one time. The arrow (←) means the selected global signal is sent to the corresponding output. FIG. 11A through FIG. 11C illustrates one embodiment of the sub multiplexer matrix corresponding to LBB-H. The connection patterns of other sub multiplexer matrixes are the same as that illustrated in FIG. 11A though FIG. 11C. In this embodiment, each global input signals has at least three paths though the global interconnect multiplex matrix to the inputs of each logic built-in block. Therefore, this embodiment of the global interconnect multiplex matrix has a routeability factor of at least 3. To increase the routeability, the connection pattern of the global interconnect multiplex matrix has been optimized to have even population feature. Combining with the local feedback signals of each logic built-in block, this embodiment of the high density programmable logic device of this invention offers enough routeability for the global and local signals, and emulates very well the 100% routeability of full-cross point of PIA in most of the applications.

The invention described is a specific embodiment and is merely illustrative of the principles of this invention and is not to be construed as the limiting factor of the invention. Various modifications and applications can be made by those skilled in the art without departing from the true spirit and scope of the invention.

What is claimed is:

1. A programmable logic device having a plurality pins comprising:

a plurality of programmable logic built-in blocks, each programmable logic built-in block having a plurality of input lines and a plurality of output lines; said plurality of output lines comprising a plurality of input feedback lines and a plurality of macro cell feedback lines, each of said programmable logic built-in blocks containing two sub AND arrays, four sub OR arrays, a plurality of macro cells and a plurality of input/output cells;

a programmable global interconnect multiplex matrix, coupled to each of said programmable logic built-in blocks, and having a plurality of input lines and output lines; said plurality of input lines of said programmable global interconnect multiplex matrix being coupled to said plurality of input feedback lines and to said plurality of macro cell feedback lines of said programmable logic built-in block;

said plurality of output lines of said programmable global interconnect multiplex matrix being coupled to said plurality of said input lines of said logic built-in block; and said programmable global interconnect multiplex matrix selectively connecting and disconnecting signals on said plurality of input lines of said programmable global interconnect multiplex matrix to said plurality of input lines of said plurality of programmable logic built-in blocks.

2. The programmable logic device of claim 1 wherein all of said programmable logic built-in blocks are identical.

3. The programmable logic device of claim 1 further comprising a global clock and input buffer wherein a global clock from said dedicated input line is distributed and other input signals from dedicated input lines are driven.

4. The programmable logic device of claim 1 wherein said four sub OR arrays are organized into two OR array groups coupling to said two sub AND arrays, each OR array group has two sub OR arrays connected by an OR array connection bit line.

5. The programmable logic device of claim 4 wherein said OR array connection bit line is programmable to connect or disconnect any one of the coupled sum terms of said two sub OR arrays of said OR array group.

6. The programmable logic device of claim 1 wherein said plurality of pins comprise a plurality of input/output pins and a plurality of dedicated input pins.

7. The programmable logic device of claim 6 wherein said plurality of dedicated input pins are connected to said programmable global interconnect multiplex matrix.

8. The programmable logic device of claim 1 wherein said two sub AND arrays are connected by an AND array connection bit line.

9. The programmable logic device of claim 8 wherein said AND array connection bit line is programmable to connect or disconnect any one of the coupled product terms of said two sub AND arrays.

10. The programmable logic device of claim 9 wherein said AND array contains a plurality of logic built-in block wide control product terms to control the set, reset, clock and output enable of said macro cells and the input/output cells within said programmable logic built-in block.

11. The programmable logic device of claim 10 wherein said plurality of logic built-in block wide control product terms are dedicated control signals, and share input signals as other product terms of said AND array.

12. A programmable logic device having a plurality pins comprising:

a plurality of programmable logic built-in blocks, each programmable logic built-in block having a plurality of input lines and a plurality of output lines; said plurality of output lines comprising a plurality of input feedback lines and a plurality of macro cell feedback lines, each of said programmable logic built-in blocks being equipped with a plurality of local feedback lines carrying local feedback signals within said programmable logic built-in block;

a programmable global interconnect multiplex matrix, coupled to each of said programmable logic built-in blocks, and having a plurality of input lines and output lines; said plurality of input lines of said programmable global interconnect multiplex matrix being coupled to said plurality of input feedback lines and to said plurality of macro cell feedback lines of said programmable logic built-in block;

said plurality of output lines of said programmable global interconnect multiplex matrix being coupled to said plurality of said input lines of said logic built-in block; and said programmable global interconnect multiplex matrix selectively connecting and disconnecting signals on said plurality of input lines of said programmable global interconnect multiplex matrix to said plurality of input lines of said plurality of programmable logic built-in blocks.

13. The programmable logic device of claim 12 wherein said a plurality of local feedback lines comprise said plurality of input feedback lines and said plurality of macro cell feedback lines.

14. A programmable logic device having a plurality pins comprising:

a plurality of programmable logic built-in blocks, each programmable logic built-in block having a plurality of input lines and a plurality of output lines; said plurality of output lines comprising a plurality of input feedback lines and a plurality of macro cell feedback lines;

a programmable global interconnect multiplex matrix, coupled to each of said programmable logic built-in blocks, and having a plurality of input lines and output lines; said plurality of input lines of said programmable global interconnect multiplex matrix being coupled to said plurality of input feedback lines and to said plurality of macro cell feedback lines of said programmable logic built-in block, each of said plurality of input lines of said programmable global interconnect multiplex matrix has at least three chances to be connected to said plurality of output lines of said programmable global interconnect multiplex matrix;

said plurality of output lines of said programmable global interconnect multiplex matrix being coupled to said plurality of said input lines of said logic built-in block; and said programmable global interconnect multiplex matrix selectively connecting and disconnecting signals on said plurality of input lines of said programmable global interconnect multiplex matrix to said plurality of input lines of said plurality of programmable logic built-in blocks.

15. The programmable logic device of claim 14 wherein said plurality of programmable multiplexers comprises programmable 29:1 multiplexers.

16. The programmable logic device of claim 14 wherein said plurality of programmable multiplexers are partitioned into a plurality of banks of twenty-four multiplexers, each bank of multiplexers is coupled to one of said plurality of programmable logic built-in blocks, the connections of said output lines of said programmable logic built-in block to said programmable multiplexers being in an exclusive mode in which the input lines feeding to said programmable multiplexers in said bank come from said programmable logic built-in blocks coupled to other said banks.

17. A programmable logic device having a plurality pins comprising:

a plurality of programmable logic built-in blocks, each programmable logic built-in block having a plurality of input lines and a plurality of output lines; said plurality of output lines comprising a plurality of input feedback lines and a plurality of macro cell feedback lines; and a plurality of programmable logical elements wherein the logical state of each said programmable logical element can be set to a desired state by connecting said programmable logical elements in a serial arrangement and passing a logical state string sequentially into said serial arrangement until said desired state is obtained in each said programmable logical element;

a programmable global interconnect multiplex matrix, coupled to each of said programmable logic built-in blocks, and having a plurality of input lines and output lines; said plurality of input lines of said programmable global interconnect multiplex matrix being coupled to said plurality of input feedback lines and to said plurality of macro cell feedback lines of said programmable logic built-in block;

said plurality of output lines of said programmable global interconnect multiplex matrix being coupled to said plurality of said input lines of said logic built-in block; and said programmable global interconnect multiplex matrix selectively connecting and disconnecting signals on said plurality of input lines of said programmable global interconnect multiplex matrix to said plurality of input lines of said plurality of programmable logic built-in blocks.

18. A programmable logic device having a plurality pins comprising:

a plurality of programmable logic built-in blocks, each programmable logic built-in block having a plurality of input lines and a plurality of output lines; said plurality of output lines comprising a plurality of input feedback lines and a plurality of macro cell feedback lines; and a plurality of programmable logical elements wherein the logical state of each said programmable logical element can be monitored by connecting said programmable logical elements in a serial arrangement, and said logical states of said programmable logical elements forming a logical state string and serially passing through said serial arrangement where said logical states of said programmable logical element can be monitored;

a programmable global interconnect multiplex matrix, coupled to each of said programmable logic built-in blocks, and having a plurality of input lines and output lines; said plurality of input lines of said programmable global interconnect multiplex matrix being coupled to said plurality of input feedback lines and to said plurality of macro cell feedback lines of said programmable logic built-in block;

said plurality of output lines of said programmable global interconnect multiplex matrix being coupled to said plurality of said input lines of said logic built-in block; and said programmable global interconnect multiplex matrix selectively connecting and disconnecting signals on said plurality of input lines of said programmable global interconnect multiplex matrix to said plurality of input lines of said plurality of programmable logic built-in blocks.

19. A programmable logic device having a plurality pins comprising:

a plurality of programmable logic arrays, each programmable logic array having a plurality of input lines and a plurality of output lines; said plurality of output lines comprising a plurality of input feedback lines and a plurality of macro cell feedback lines; and a plurality of programmable logical elements wherein the logical state of each said programmable logical element can be set to a desired state by connecting said programmable logical elements in a serial arrangement and passing a logical state string sequentially into said serial arrangement until said desired state is obtained in each said programmable logical element;

a programmable global interconnect multiplex matrix, coupled to each of said programmable logic arrays and having a plurality of input lines and output lines; said plurality of input lines of said programmable global interconnect multiplex matrix being coupled to said plurality of input feedback lines and plurality of macro cell feedback lines of output lines of said programmable logic arrays; said plurality of output lines of said programmable global interconnect multiplex matrix being coupled to said plurality of said input lines of said logic arrays; said programmable global interconnect multiplex matrix selectively connecting and disconnecting signals on said plurality of input lines of said programmable global interconnect multiplex matrix to said plurality of input lines of said plurality of programmable logic arrays; and a global clock and input buffer wherein global clocks are distributed and dedicated input signals are driven.

20. The programmable logic device of claim 19 wherein all of said programmable logic arrays are identical.

21. The programmable logic circuit of claim 19 wherein said logic arrays further comprise a plurality of sequential logic elements.

22. The programmable logic device of claim 19 wherein said plurality of pins comprise a plurality of input/output pins and a plurality of input pins.

23. The programmable logic device of claim 19 wherein said plurality of dedicated input pins are connected to said programmable global interconnect multiplex matrix.

24. The programmable logic device of claim 19 wherein said programmable global interconnect multiplex matrix comprises a plurality of programmable multiplexers connected to said plurality of input lines and said plurality of output lines of said programmable global interconnect multiplex matrix.

25. The programmable logic device of claim 24 wherein each of said plurality of programmable multiplexers has a size so that said plurality of input lines of said programmable global interconnect multiplex matrix has at least three chances to be connected to said plurality of output lines of said programmable global interconnect multiplex matrix.

26. The programmable logic device of claim 24 wherein said plurality of programmable multiplexers are partitioned into a plurality of banks of twenty-four multiplexers, each bank of multiplexers is coupled to one of said plurality of programmable logic arrays, the connections of said output lines of said programmable logic arrays to said programmable multiplexers are in an exclusive mode in which the input lines feeding to said programmable multiplexers in a said bank come from said programmable logic built-in blocks coupled to other said banks.

27. A programmable logic device having a plurality pins comprising:

a plurality of programmable logic arrays, each programmable logic array having a plurality of input lines and a plurality of output lines; said plurality of output lines comprising a plurality of input feedback lines and a plurality of macro cell feedback lines; and a plurality of programmable logical elements wherein the logical state of each said programmable logical element can be monitored by connecting said programmable logic elements in a serial arrangement, and said logical states of said programmable logical elements forming a logical state string and serially passing through said serial arrangement where said logical state of said programmable logical element can be monitored;

a programmable global interconnect multiplex matrix, coupled to each of said programmable logic arrays and having a plurality of input lines and output lines; said plurality of input lines of said programmable global interconnect multiplex matrix being coupled to said plurality of input feedback lines and plurality of macro cell feedback lines of output lines of said programmable logic arrays; said plurality of output lines of said programmable global interconnect multiplex matrix being coupled to said plurality of said input lines of said logic arrays; said programmable global interconnect multiplex matrix selectively connecting and disconnecting signals on said plurality of input lines of said programmable global interconnect multiplex matrix to said plurality of input lines of said plurality of programmable logic arrays; and a global clock and input buffer wherein global clocks are distributed and dedicated input signals are driven.

* * * * *